(12) United States Patent
Kawasaki et al.

(10) Patent No.: US 7,751,456 B2
(45) Date of Patent: Jul. 6, 2010

(54) METHOD FOR MANUFACTURING SEMICONDUCTOR OPTICAL DEVICE

(75) Inventors: Kazushige Kawasaki, Tokyo (JP); Toshiaki Kitano, Tokyo (JP); Takafumi Oka, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 469 days.

(21) Appl. No.: 11/930,395

(22) Filed: Oct. 31, 2007

(65) Prior Publication Data

US 2008/0280386 A1     Nov. 13, 2008

(30) Foreign Application Priority Data

May 8, 2007     (JP)     ............... 2007-123861

(51) Int. Cl.
*H01S 5/00*     (2006.01)
(52) U.S. Cl. ............... 372/46.01; 257/79; 257/E33.002; 438/689; 438/39; 372/50.21
(58) Field of Classification Search ............... 257/79, 257/E33.002; 438/39, 689; 372/46.01, 50.21
See application file for complete search history.

(56) References Cited

U.S. PATENT DOCUMENTS

| 6,171,876 | B1 * | 1/2001 | Yuang et al. | ............... 438/22 |
| 6,335,215 | B1 * | 1/2002 | Yuang | ............... 438/31 |
| 6,620,641 | B2 | 9/2003 | Yamaguchi et al. | |
| 6,784,010 | B2 | 8/2004 | Yamaguchi et al. | |
| 7,177,336 | B2 | 2/2007 | Taneya et al. | |
| 7,680,172 | B2 * | 3/2010 | Kuramoto | ............... 372/50.21 |
| 2006/0222030 | A1 * | 10/2006 | Saitoh et al. | ............... 372/46.01 |

FOREIGN PATENT DOCUMENTS

| JP | 2000-12970 | 1/2000 |
| JP | 2000-22261 | 1/2000 |
| JP | 2000-114664 | 4/2000 |
| JP | 2000-164987 | 6/2000 |
| JP | 2000-340880 | 12/2000 |
| JP | 2002-171028 | 6/2002 |
| JP | 2002-208753 | 7/2002 |
| JP | 2002-335048 | 11/2002 |
| JP | 2003-142769 | 5/2003 |
| JP | 2004-253545 | 9/2004 |
| WO | WO 03/085790 | 10/2003 |

* cited by examiner

*Primary Examiner*—David Vu
*Assistant Examiner*—Brandon Fox
(74) *Attorney, Agent, or Firm*—Leydig, Voit & Mayer, Ltd.

(57) ABSTRACT

A method for manufacturing an laser diode includes: providing a wafer having thereon a semiconductor structure; depositing an $SiO_2$ film; forming channels and a waveguide ridge between the channels in the wafer; forming an $SiO_2$ film over the wafer; forming a resist pattern covering the $SiO_2$ film in the channels such that the top surfaces of the resist pattern are lower than the top surface of the deposited $SiO_2$ film on the top of the waveguide ridge, the resist pattern exposing the $SiO_2$ film on the top of the waveguide ridge; removing the $SiO_2$ film and the deposited $SiO_2$ film by wet etching, using the resist pattern as a mask, to expose a p-GaN layer in the waveguide ridge; and forming an electrode layer on the top surface of the p-GaN layer.

6 Claims, 6 Drawing Sheets

METHOD FOR MANUFACTURING SEMICONDUCTOR OPTICAL DEVICE

BACKGROUND OF THE INVENTION

1. Field of the Invention

The present invention relates to a method for manufacturing a semiconductor optical device, and more particularly to a method for manufacturing a semiconductor optical device in which the waveguide ridge has an electrode on its top.

2. Description of the Related Art

There has been a need for emission of light in the blue to ultraviolet wavelength range to enhance the recording density of optical discs. In order to meet such a need, intense R&D effort has recently been carried out to develop nitride semiconductor lasers formed of a Group III-V nitride compound semiconductor such as AlGaInN. Some of them have already been practically used.

Such blue-violet laser diodes (hereinafter referred to as "blue-violet LDs") are formed by growing a compound semiconductor in crystal form on a GaN substrate.

A representative compound semiconductor is the Group III-V compound semiconductor, in which Group III and V elements are combined together. Mixed crystal III-V compound semiconductors having different compositions can be formed by bonding pluralities of Group III atoms and Group V atoms in different manners. Examples of compound semiconductors used to form a blue-violet LD include GaN, GaPN, GaNAs, InGaN, and AlGaN.

In ridge waveguide LDs, an electrode layer is usually provided on top of the waveguide ridge. This electrode layer is connected to the contact layer (i.e., the top layer of the waveguide ridge) through an opening formed in the insulating film covering the top portion of the waveguide ridge. This insulating film with the above opening is formed by lift-off using the same resist mask that was used to form the waveguide ridge. However, since the surface of the resist mask in contact with the contact layer is concavely curved with respect to the surface of the contact layer, part of the material used to form the insulating film covering the waveguide ridge remains in this concave portion and hence partly covers the surface of the contact layer even after the lift-off process, resulting in a reduction in the contact area between the electrode layer and the contact layer. That is, the contact area is smaller than the top surface area of the contact layer.

In the case of a red LD, this reduction in the contact area between the electrode layer and the contact layer due to the lift-off process does not significantly increase the contact resistance and hence the operating voltage of the LD, since the material used to form the contact layer (e.g., GaAs, etc.) has a relatively low contact resistance.

In the case of a blue-violet LD, on the other hand, the material used to form the contact layer is GaN, etc. having a relatively high contact resistance. Therefore, a reduction in the contact area between the electrode and the contract layer results in an increase in the contact resistance between them, thereby increasing the operating voltage of the blue-violet LD.

There will now be described several known methods for manufacturing an LD in such way as to prevent a reduction in the contact area between the electrode and the contact layer.

A first method forms a nitride semiconductor laser device in the following manner. First, a p-type electrode layer of palladium/molybdenum/gold is formed on a p-type contact layer which is the top layer of the semiconductor layer stack formed on a wafer. A resist mask (not shown) having a stripe shape is then formed on the p-type electrode layer and used to form a ridge stripe by RIE (Reactive Ion Etching). More specifically, the p-type electrode is formed by etching using Ar gas, and then the p-type contact layer and the p-type cladding layer, or these layers and the p-guiding layer, are etched by a mixed gas composed of Ar, $Cl_2$, and $SiCl_4$ to form the ridge stripe. (The etching is stopped at a depth halfway through the p-type cladding layer or the p-guiding layer.) Next, an insulating film (of Zr oxide predominantly including $ZrO_2$) having a thickness of 0.5 μm is formed over the surface of the wafer with the ridge strip still leaving the resist thereon. The resist is then removed to expose the top surface of the ridge stripe. Further, a p-type pad electrode of molybdenum and gold is formed to cover the p-type electrode and at least the portions of the insulating film on both sides of the p-type electrode. (See, e.g., Japanese Domestic Republication of International Patent Application No. WO 2003/085790, lines 42-50 on page 9, FIG. 1.)

A second known method is a self-aligning method for manufacturing a ridge waveguide semiconductor LD and includes the step of forming two different photoresist layers one on top of the other, as described below.

The lower photoresist layer is only sensitive to light of wavelengths shorter than 300 nm, while the upper photoresist layer is only sensitive to light of wavelengths longer than 300 nm. Specifically, this self-aligning method is applied to a laminated semiconductor structure that includes a second cladding waveguide layer and a capping layer formed on the second cladding waveguide layer. The method begins by removing portions of the capping layer and the second cladding waveguide layer to form a ridge structure and a double channel. A second insulating film is then formed on the surfaces of the ridge structure and the double channel. A first photoresist layer (the lower photoresist layer) is then formed on the second insulating film, and a second photoresist layer (the upper photoresist layer) is formed on the first photoresist layer. Next, the second photoresist layer is patterned to expose the portions of the first photoresist layer around the ridge structure. Further, the first photoresist layer is processed by an RIE process to expose the portion of the second insulating film on the ridge structure. The portions of the second insulating film around the ridge structure are then removed by an etching process including an RIE process. The remaining portions of the first and second photoresist layers are then removed, and a first metal layer is deposited as an electrode. (See, e.g., Japanese Laid-Open Patent Publication No. 2000-22261, paragraphs 0024 to 0034, FIGS. 7 to 18.)

A third known method first forms a ridge and channels by wet etching the contact layer using a metal mask of Al and then wet etching the underlying layer using as a mask this contact layer with the metal mask still thereon. Next, an insulating film is formed over the entire surface of the substrate by plasma CVD, and the Al pattern (the metal mask) and the overlying portions of the insulating film are removed by lift-off. A resist pattern is then formed by a common lithographic process. (This resist pattern exposes the portion of the surface where a p-type electrode is subsequently formed.) A layer of electrode material is then formed by vacuum deposition using the resist pattern as a mask, and subsequently the resist pattern and the overlying portion of the electrode material layer are removed by lift-off to form the electrode in close contact with the contact layer of the ridge. (See, e.g., Japanese Laid-Open Patent Publication No. 2000-340880, paragraphs 0025 to 0034, FIG. 1.)

A fourth known method proceeds as follows. A first protective film is formed over substantially the entire surface of the p-side contact layer, and a third protective film having a stripe shape is formed on the first protective film. Then, after etching the first protective film with the third protective film thereon, the third protective film is removed. Then the first protective film having a stripe shape is formed. The p-side contact layer is then etched through its entire thickness and the underlying layer (for example, a p-side cladding layer) is etched halfway through its thickness to form a waveguide having a stripe shape. Next, a second protective film (which has electrically insulating properties and is made of a different material than the first protective film) is formed on the sides of the stripe-shaped waveguide and on the top surface of the nitride semiconductor layer (i.e., the p-side cladding layer) exposed by the above etching process. The first protective film is then removed by lift-off, and a p-electrode is formed on the second protective film and the p-side contact layer such that the p-electrode is electrically connected to the p-side contact layer. (See, e.g., Japanese Laid-Open Patent Publication No. 2003-142769, paragraphs 0020 to 0027, FIG. 1.)

The above conventional methods provide a sufficient contact area between the contact layer of the waveguide ridge and the electrode layer. However, these methods are disadvantageous in that it is difficult to reliably manufacture devices having substantially equal characteristics, since they include the step of: etching a metal film and the underlying semiconductor layer at the same time; etching the lower of two laminated resist layers to a predetermined controlled depth; or forming an electrode by lift-off after forming a metal film mask or a plurality of protective films. Furthers employing a plurality of resists or protective films results in reduced freedom in process design.

In order to overcome the above problems, a method has been proposed for manufacturing a semiconductor optical device in such a way to reliably prevent a reduction in the contact area between the top semiconductor layer (or contact layer) of the waveguide ridge and the overlying electrode layer by employing a simple process.

This method proceeds as follows. Channels are formed in a wafer having a semiconductor layer stack formed thereon, thereby forming a waveguide ridge. An $SiO_2$ film is then formed over the entire surface of the wafer. A resist is then applied over the entire surface of the wafer to form a resist film having a greater thickness on the channels than on the top of the waveguide ridge. Next, material is uniformly removed by dry etching from the surface of the resist film so that the film is completely removed from on top of the waveguide ridge but left in the channels, thereby forming a resist pattern that exposes the top of the waveguide ridge but left in the channels. The exposed surface of the $SiO_2$ film is then uniformly etched using the resist pattern as a mask so that the film is completely removed from on top of the waveguide ridge but left on the sides and bottoms of the channels. The remaining portion of the $SiO_2$ film has an opening that exposes the top of the waveguide ridge.

Then, after removing the resist pattern, a p-side electrode is formed on the top of the waveguide ridge.

Several known processes for forming a ridge will now be described. A first known process forms a ridge stripe using a p-type ohmic electrode as a mask in the following manner. First, a stripe-shaped metal layer stack (including a first layer of Ni/Au and a second layer of Pt) is formed on the top surface of the p-contact layer of GaN. The wafer is then heat treated to alloy these metal layers to form the p-side ohmic electrode. Next, the wafer is etched in an etching gas of $Cl_2$ using the p-side ohmic electrode as a mask until the p-type guiding layer is exposed. (See, e.g., Japanese Laid-Open Patent Publication No. 2004-253545, paragraphs 0035 to 0038, FIG. 2.)

A second known process for forming a ridge proceeds as follows.

At a first step, a first protective film of an Si oxide is formed over substantially the entire surface of the p-side contact layer, and a stripe-shaped third protective film is formed on the first protective film. The first protective film with the third protective film thereon is then etched into a stripe shape, and the third protective film is removed.

At a second step, the portions of the p-side contact layer and the p-side cladding layer which are not covered by the first protective film are etched to form a stripe-shaped waveguide region corresponding to the shape of the first protective film under the first protective film.

At a third step, a second protective film (which has electrically insulating properties and which is made of a different material than the first protective film) is formed on the sides of the stripe-shaped waveguide, on the etched and exposed top surface of the nitride semiconductor layer (i.e., the p-side cladding layer), and on the first protective film. The first protective film and the overlying portion of the second protective film on the first protective film are then removed by etching, leaving the second protective film on the sides of the stripe-shaped waveguide and the top surface of the p-side cladding layer. The remaining portion of the second protective film continuously extends from the sides of the stripe to the top surface of the p-side cladding layer.

The etching at the above third step may be, but is not limited to, dry etching using hydrofluoric acid. (See, e.g., Japanese Laid-Open Patent Publication No. 2000-114664, paragraphs 0018 to 0024, FIG. 6.)

A third known process for forming a ridge proceeds as follows.

First, layers of GaN-based material are epitaxially grown on a sapphire substrate, and a first $SiO_2$ film (a first mask) having a stripe shape is formed on the top layer (a p-GaN contact layer). Dry etching is then performed using the first $SiO_2$ film as a mask to form a ridge stripe.

Next, an AlGaN burying layer is uniformly formed on both sides of the ridge stripe and on the first $SiO_2$ film, and a second $SiO_2$ film (a second mask) is formed on the AlGaN burying layer. A resist film is then formed on the second $SiO_2$ film by spin coating such that the resist film has a smaller thickness on the top of the ridge stripe than on both sides of the ridge stripe. The portion of the resist film above the top of the ridge stripe is removed by dry etching using oxygen gas, etc. to expose the second $SiO_2$ film (or second mask). Subsequently, the exposed portion of the second $SiO_2$ film is selectively etched using $CF_4$ to expose the AlGaN burying layer. The remaining resist film is then removed by ashing to expose the second $SiO_2$ film. The AlGaN burying layer is then partially removed by wet etching using the second $SiO_2$ film as a mask to expose the first $SiO_2$ film (or first mask) on the top of the ridge stripe. Lastly, the first $SiO_2$ film (or first mask) and the second $SiO_2$ film (or second mask) are removed by wet etching. (See, e.g., Japanese Laid-Open Patent Publication No. 2000-164987, paragraphs 0030 to 0040, FIGS. 2 to 12.)

Further, a fourth known process for forming a ridge proceeds as follows.

First, a laminated structure of GaN-based material is formed on a sapphire substrate by MOCVD, etc., and a stripe-shaped second electrode is formed on the second contact layer of the laminated structure. A ridge structure is then formed using this second electrode as a mask. Next, an $SiO_2$ insulating film is formed to entirely cover the ridge structure and the second cladding layer on both sides of the ridge structure (the ridge structure including the second electrode, the second contact layer, and a portion of the second cladding layer). A resist film is then applied over this insulating film such that the resist film has a smaller thickness on the ridge structure than on both sides of the ridge structure. The top surface of the resist film is substantially flat and level. Etching is then performed to expose the top surface and both sides of the second electrode and the upper portions of both sides of the contact layer and thereby form a stripe-shaped metal film having a width corresponding to the width of the mesa structure. (See, e.g. Japanese Laid-Open Patent Publication No. 2002-335048, paragraphs 0064 to 0073, FIGS. 3 to 6.)

Thus, conventional methods for manufacturing an optical semiconductor device include the following steps: channels are formed in a wafer, thereby forming a waveguide ridge; an $SiO_2$ film is formed over the entire surface of the wafer; a resist is applied over the $SiO_2$ film to form a resist film; a material is removed from the surface of the resist film so that the film is completely removed from on top of the waveguide but left in the channels, thereby forming a resist pattern that exposes the top of the waveguide ridge; and the exposed surface of the $SiO_2$ film is uniformly etched using the resist pattern as a mask so that the $SiO_2$ film is completely removed from on top of the waveguide ridge but left on the sides and bottoms of the channels (that is, the remaining portion of the $SiO_2$ film has an opening that exposes the top of the waveguide ridge). In the above last step, if dry etching is used to remove the $SiO_2$ film from on top of the waveguide ridge, the semiconductor layer underlying the $SiO_2$ film may be damaged under certain circumstances. For example, when the underlying semiconductor layer is a p-type contact layer, it may be damaged by the etching process, resulting in an increased contact resistance. Especially, if the p-type contact layer is made of a GaN-based material, the damaged portion(s) is difficult to remove by wet etching, since it is difficult to remove GaN-based material from a surface by wet etching.

SUMMARY OF THE INVENTION

The present invention has been made to solve the above problems. It is, therefore, a primary object of the present invention to provide a method for manufacturing a semiconductor optical device with a high yield and in such a way as to reliably prevent a reduction in the contact area between the top semiconductor layer of the waveguide ridge and the overlying electrode layer and prevent damage to the top semiconductor layer due to etching by employing a simple process.

According to one aspect of the present invention, there is provided a method for manufacturing a semiconductor optical device comprising: forming a dielectric film on a top surface of a laminated semiconductor structure, the laminated semiconductor structure made up of a first semiconductor layer of a first conductive type, an active layer, and a second semiconductor layer of a second conductive type in sequence on a substrate; forming by a photolithography process a first resist pattern of a resist film disposed on a surface of the dielectric film, the first resist pattern having a stripe-shaped portion corresponding to a waveguide ridge; removing the dielectric film by etching using the first resist pattern as a mask to expose the second semiconductor layer; removing portions of the upper surface side of the second semiconductor layer by dry etching using the first resist pattern as a mask to form concave portions leaving a part of the second semiconductor layer on the bottom, and to form the waveguide ridge put into the concave portions; forming a first insulating film on surfaces of the concave portions and the waveguide ridge with the dielectric film at the top surface thereof after removing the first resist pattern; forming a second resist pattern covering the first insulating film in the concave portions adjacent the waveguide ridge and exposing the surface of the first insulating film on the top of the waveguide ridge, the second resist pattern having a top surface on the concave portions being lower than a top surface of the first insulating film on a top of the waveguide ridge; removing the first insulating film and the dielectric film by etching including wet etching using the second resist pattern as a mask to expose the second semiconductor layer in the waveguide ridge, and removing the second resist pattern; and forming a metal electrode layer on the exposed surface of the second semiconductor layer in the waveguide ridge.

Accordingly, this arrangement allows the electrode layer to be formed on and in full contact with the second semiconductor layer while avoiding a reduction in the contact area between them. Furthermore, the opening is formed by first removing portions of the first insulating film and then removing the dielectric film by etching including wet etching using the second resist pattern as a mask. Therefore, it is possible to avoid damages to the second semiconductor layer and thereby prevent an increase in the contact resistance between the second semiconductor layer and the electrode layer.

Other objects and advantages of the invention will become apparent from the detailed description given hereinafter. It should be understood, however, that the detailed description and specific embodiments are given by way of illustration only since various changes and modifications within the scope of the invention will become apparent to those skilled in the art from this detailed description.

BRIEF DESCRIPTION OF THE DRAWINGS

In all figures, the substantially same elements are given the same reference numbers.

DESCRIPTION OF THE PREFERRED EMBODIMENTS

While preferred embodiments of the present invention will be described with reference to blue-violet LDs (a type of semiconductor optical device), it is to be understood that the invention is not limited to blue-violet LDs. The present invention can be applied to any semiconductor optical device such as a red LD, with the same effect.

First Embodiment

Figure 1:
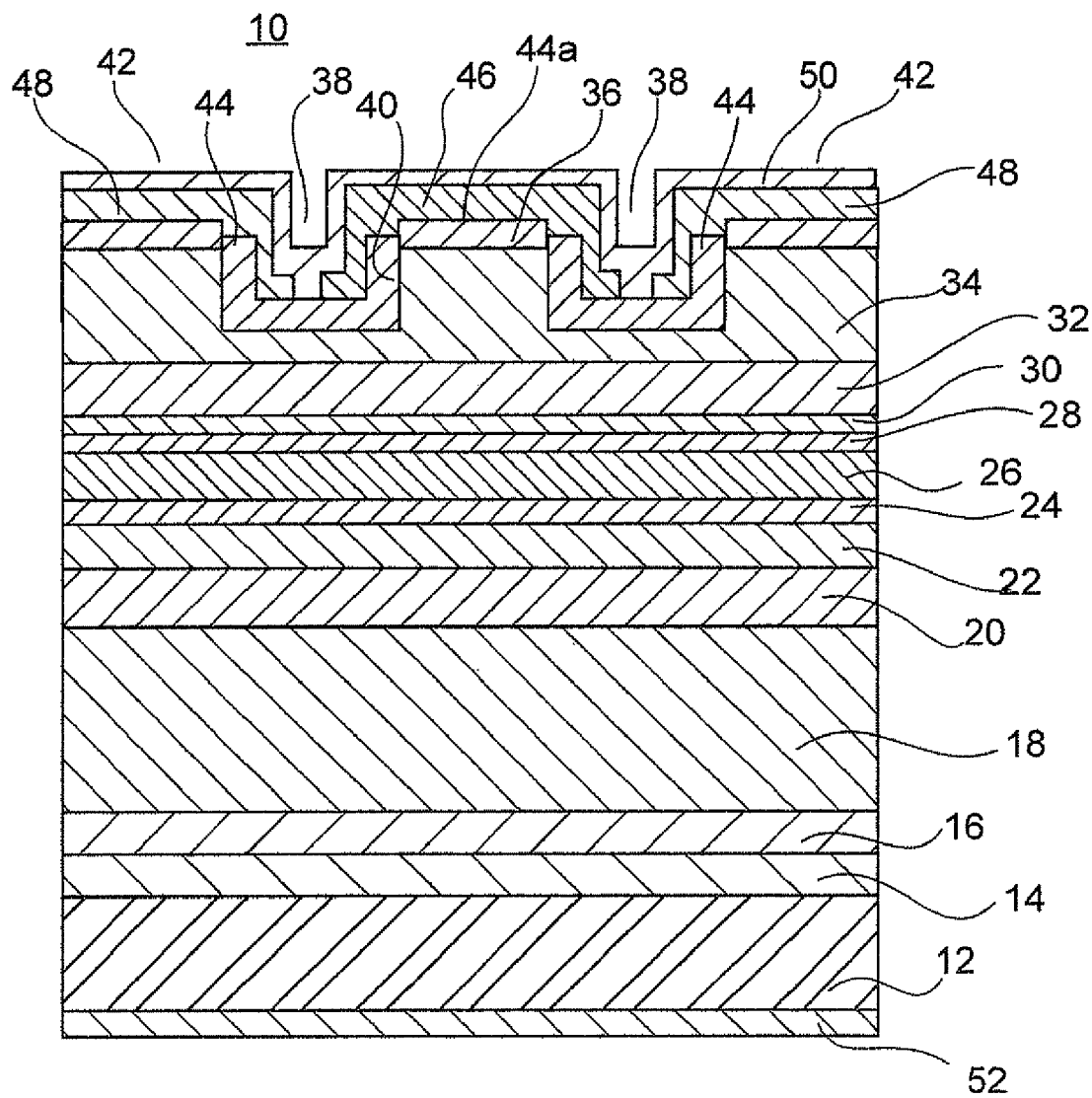
FIG. 1 is a cross-sectional view of an LD according to one embodiment of the present invention.

FIG. 1 is a cross-sectional view of an LD according to one embodiment of the present invention. It should be noted that in the figures, like numerals are used to denote like or corresponding components.

Referring to FIG. 1, the LD 10 is a ridge waveguide blue-violet LD in which the following layers are sequentially formed on top of one another on one principal surface (a Ga surface) of an n-type GaN substrate 12 (n-type, p-type, and i-type (undoped) being hereinafter abbreviated as "n-," "p-," and "i-," respectively): a buffer layer 14 of n-GaN; a first n-cladding layer 16 of n-AlGaN formed on the buffer layer 14; a second n-cladding layer 18 of n-AlGaN formed on the first n-cladding layer 16; a third n-cladding layer 20 of n-Al- GaN formed on the second n-cladding layer 18; an n-side light guiding layer 22 of n-GaN formed on the third n-cladding layer 20; an n-side SCH (Separate Confinement Heterostructure) layer 24 of InGaN; and an active layer 26 on the n-side SCH layer 24. It should be noted that the first to third n-cladding layers 16, 18, 20 constitute a first semiconductor layer.

Further, the following layers are sequentially formed on top of one another on the active layer 26: a p-side SCH layer 28 of InGaN; an electron barrier layer 30 of p-AlGaN; a p-side light guiding layer 32 of p-GaN; a p-cladding layer 34 of p-AlGaN; and a contact layer 36 of p-GaN. According to the present embodiment, the p-cladding layer 34 and the contact layer 36 constitute a second semiconductor layer. In other embodiments, however, only one layer, or three or more layers, may constitute the second semiconductor layer.

Channels 38 serving as concave portions are formed in the contact layer 36 and the p-cladding layer 34. As a result, the contact layer 36 and the portion of the p-cladding layer 34 in contact with the contact layer 36 form a waveguide ridge 40.

The waveguide ridge 40 is located in a center portion of the width of the cleaved surfaces (or resonator end faces) of the LD 10 and extends between the resonator end faces. The longitudinal dimension of the waveguide ridge 40, that is, the resonator length, is 1000 μm, and the ridge width perpendicular to the longitudinal direction is one micron to a few tens of microns. The present embodiment assumes this width to be 1.5 μm.

Further according to the present embodiment, the width of the channels is 10 μm. The raised platform portions on both sides of the waveguide ridge 40 with the channels 38 therebetween are referred to herein as the "electrode pad platforms 42."

The height of the waveguide ridge 40, that is, its height from the bottom surface of the channels 38, is, for example, 0.5 μm.

A first silicon oxide film 44, serving as a first insulating film, covers both sides of the channels 38 (i.e., the sidewalls of the waveguide ridge 40 and the sidewalls of the electrode pad platforms 42) and the bottom surfaces of the channels 38. The top edges of the first silicon oxide film 44 that covers the sides of the channels 38 are slightly lower than the top surface of the contact layer 36.

The first silicon oxide film 44 is made up of, for example, an $SiO_2$ film having a thickness of 200 nm. The first silicon oxide film 44 does not cover the top surface of the contact layer 36; it has an opening 44a that exposes the entire top surface of the contact layer 36 and upper portions of both sides of the contact layer 36.

A p-side electrode 46 is disposed on and electrically coupled to the top surface of the contact layer 36. The p-side electrode 46 is formed by sequentially depositing platinum (Pt) and Au by vacuum deposition. It closely covers the top surface of the contact layer 36, the upper portions of both sides of the contact layer 36, and the top edges of the first silicon oxide film 44, and also covers the first silicon oxide film 44 on the sidewalls of the waveguide ridge 40 and on portions of the bottom surfaces of the channels 38.

Further, a second silicon oxide film 48 formed, for example, of $SiO_2$ covers the top surfaces of the electrode pad platforms 42 and also covers the first silicon oxide film 44 on the sides of the electrode pad platforms 42 (within channels 38) and on portions of the bottom surfaces of the channels 38.

A pad electrode 50 is disposed on and in close contact with the top surface of the p-side electrode 46. It extends to cover the p-side electrode 46, the first silicon oxide film 44, and the second silicon oxide film 48 within both channels 38 and also cover the second silicon oxide film 48 on the top surfaces of the electrode pad platforms 42.

Further, an n-side electrode 52 is disposed on the bottom surface of the n-GaN substrate 12. The n-side electrode 52 is formed by sequentially depositing Ti and Au films by vacuum deposition.

This LD 10 is doped with silicon (Si) and magnesium (Mg), which act as n-type and p-type impurities, respectively.

The n-GaN substrate 12 has a thickness of approximately 100 μm, and the buffer layer 14 has a thickness of approximately 1 μm. The first n-cladding layer 16 has a thickness of approximately 400 nm and is formed, for example, of n-$Al_{0.07}Ga_{0.93}N$. The second n-cladding layer 18 has a thickness of approximately 1000 nm and is formed, for example, of n-$Al_{0.045}Ga_{0.955}N$. The third n-cladding layer 20 has a thickness of approximately 300 nm and is formed, for example, of n-$Al_{0.015}Ga_{0.985}N$.

The n-side light guiding layer 22 has a thickness of, for example, 80 nm. The n-side SCH layer 24 has a thickness of 30 nm and is formed of i-$In_{0.02}Ga_{0.98}N$.

The active layer 26 has a double quantum well structure made up of a well layer 26a (not shown) of i-$In_{0.12}Ga_{0.88}N$ having a thickness of 5 nm, a barrier layer 26b (not shown) of i-$In_{0.02}Ga_{0.98}N$ having a thickness of 8 nm, and a well layer 26c (not shown) of i-$In_{0.12}Ga_{0.88}N$ having a thickness of 5 nm. The well layer 26a is disposed on and in contact with the n-side SCH layer 24, the barrier layer 26b is disposed on the well layer 26a, and the well layer 26c is disposed on the barrier layer 26b.

The p-side SCH layer 28 disposed on and in contact with the well layer 26c of the active layer 26 has a thickness of 30 nm and is formed of i-$In_{0.02}Ga_{0.98}N$.

The electron barrier layer 30 has a thickness of approximately 20 nm and is formed of p-$Al_{0.2}Ga_{0.8}N$. The p-side light guiding layer 32 has a thickness of 100 nm, and the p-cladding layer 34 has a thickness of approximately 500 nm and is formed of p-$Al_{0.07}Ga_{0.93}N$. The contact layer 36 has a thickness of 20 nm.

There will now be described a method for manufacturing the LD 10.

FIGS. 2 to 13 are partial cross-sectional views illustrating process steps in a method for manufacturing an LD according to the present invention.

It should be noted that FIGS. 2 to 13 do not show the electron barrier layer 30 and the underlying layers including the n-GaN substrate 12, since these layers do not change in any way in the process steps described below. These figures only show a cross section of a portion of the p-side light guiding layer 32 and a cross section of each overlying layer.

The manufacturing method begins by providing a GaN substrate 12 whose surfaces have been cleaned by thermal cleaning, etc. An n-GaN layer (which is or will become the buffer layer 14) is then formed on the GaN substrate 12 by metalorganic chemical vapor deposition (MOCVD) at a growth temperature of, e.g., 1000° C.

Next, the following layers are sequentially formed on top of one another: an n-$Al_{0.07}Ga_{0.93}N$ layer (which is or will become the first n-cladding layer 16); an n-$Al_{0.045}Ga_{0.955}N$ layer (the second n-cladding layer 18); an n-$Al_{0.015}Ga_{0.985}N$ layer (the third n-cladding layer 20); an i-$In_{0.02}Ga_{0.98}N$ layer (the n-side light guiding layer 22); and an i-$In_{0.02}Ga_{0.98}N$ layer (the n-side SCH layer 24). Further, an i-$In_{0.12}Ga_{0.88}N$ layer (which is or will become the well layer 26a), an i-$In_{0.02}Ga_{0.98}N$ layer (the barrier layer 26b), and an i-$In_{0.12}Ga_{0.88}N$ layer (the well layer 26c) are sequentially formed on top of one another on the n-side SCH layer 24. (The well layers 26a and 26c and the barrier layer 26b sandwiched therebetween form the active layer 26, as described above.)

Figure 2:
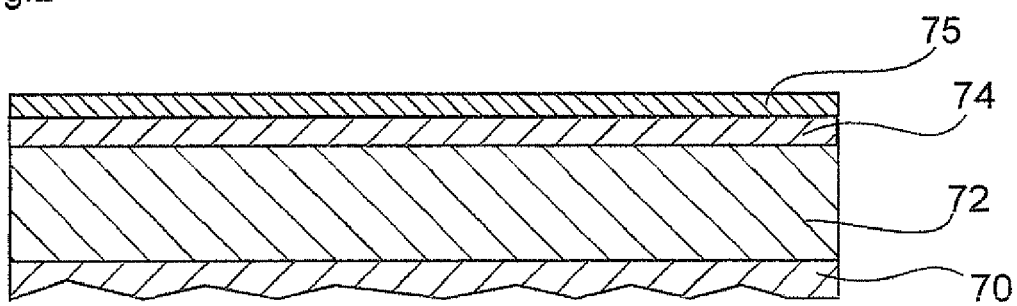
FIGS. 2 to 13 are partial cross-sectional views illustrating process steps in a method for manufacturing an LD according to the present invention.

Next, the following layers are sequentially formed on top of one another on the active layer 26: an i-$In_{0.02}Ga_{0.98}N$ layer (which is or will become the p-side SCH layer 28); a p-$Al_{0.2}Ga_{0.8}N$ layer (the electron barrier layer 30); a p-$Al_{0.2}Ga_{0.8}N$ layer 70 (the p-side light guiding layer 32); a p-$Al_{0.07}Ga_{0.93}N$ layer 72 (the p-cladding layer 34); and a p-GaN layer 74 (the contact layer 36). As a result, the wafer has formed thereon a laminated semiconductor structure as shown in FIG. 2. Further, an $SiO_2$ film 75 serving as a dielectric film is deposited onto the p-GaN layer 74 by vacuum deposition. Since film formation by deposition does not cause significant damage to the underlying layer, the $SiO_2$ film 75 can be formed without any significant damage to the p-GaN layer 74 in the above process.

It should be noted that instead of the $SiO_2$ film 75, one of the following films may be deposited: SiN, $Al_2O_3$, $Ta_2O_5$, $ZrO_2$, MgO, SiC, and $TiO_2$ films.

The thickness of the deposited $SiO_2$ film 75 is preferably 10 nm-200 nm, more preferably 20 nm-50 nm. The present embodiment assumes it to be 40 nm. FIG. 2 shows the results of this process step.

Figure 3:
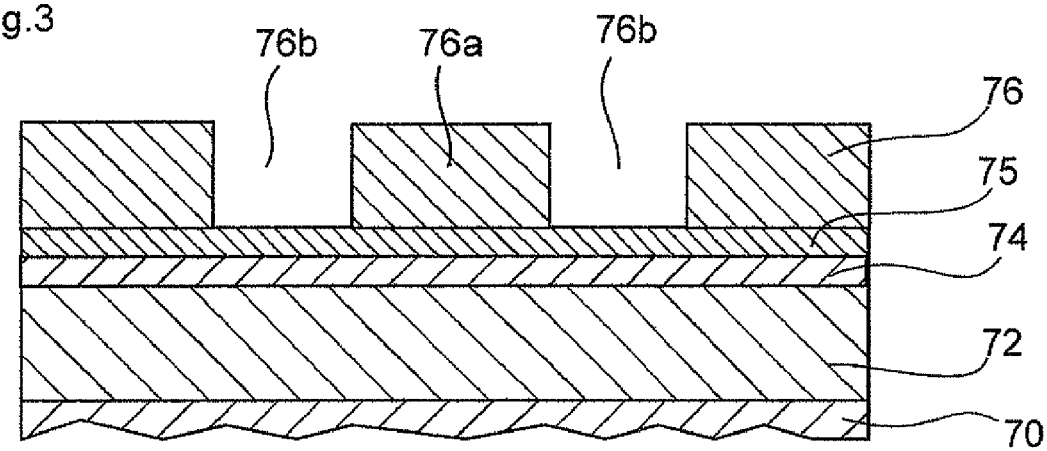

Referring now to FIG. 3, a resist is applied over the entire surface of the laminated semiconductor structure whose top layer is the deposited $SiO_2$ film 75, and this resist is patterned into a resist pattern 76 serving as a first resist pattern by a photolithography process. The resist pattern 76 includes a portion 76a remaining in correspondence to the shape of the waveguide ridge 40 formed later in the process and cutout portions 76b corresponding to the shapes of the channels 38, as shown in FIG. 3. According to the present embodiment, the portion 76a corresponding to the shape of the waveguide ridge 40 has a width of 1.5 µm, and the cutout portions 76b corresponding to the shapes of the channels 38 have a width of 10 µm.

Figure 4:
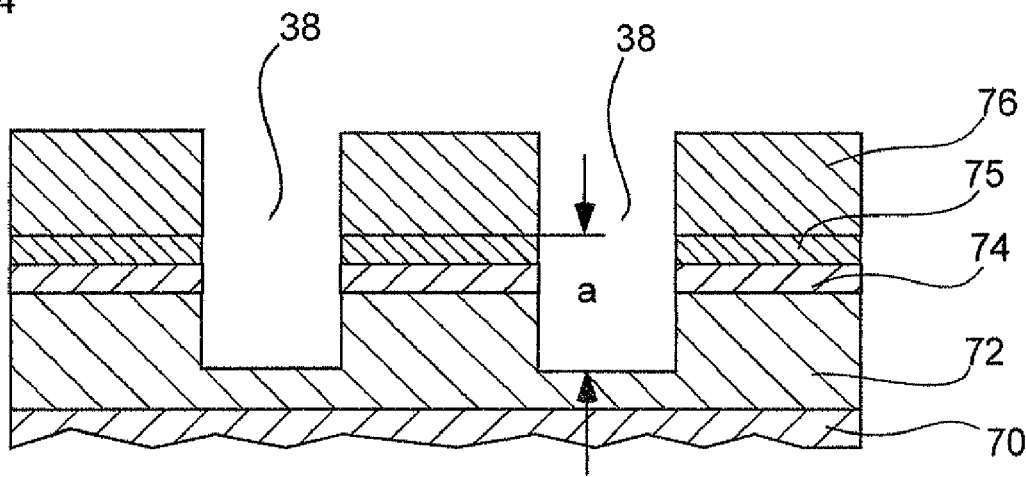

Referring now to FIG. 4, the deposited $SiO_2$ film 75 and the p-GaN layer 74 are etched through their entire thickness and the p-$Al_{0.07}Ga_{0.93}N$ layer 72 is etched to a predetermined depth using the resist pattern 76 as a mask to form the channels 38 whose bottoms are defined by remaining portions of the p-$Al_{0.07}Ga_{0.93}N$ layer 72.

More specifically, first, the deposited $SiO_2$ film 75 is patterned into a stripe-shaped pattern by dry or wet etching using the resist pattern 76 as a mask.

The p-GaN layer 74 is then etched through its entire thickness and the p-$Al_{0.07}Ga_{0.93}N$ layer 72 is etched to a predetermined depth by RIE (Reactive Ion Etching) using the resist pattern 76 as a mask to form the channels 38 whose bottoms are defined by remaining portions of the p-$Al_{0.07}Ga_{0.93}N$ layer 72.

According to the present embodiment, the entire etch depth a is approximately 500 nm (or 0.5 µm) plus the thickness of the deposited $SiO_2$ film 75 (see FIG. 4).

Forming the channels 38 results in the formation of the waveguide ridge 40 and the electrode pad platforms 42, as shown in FIG. 4.

Figure 5:
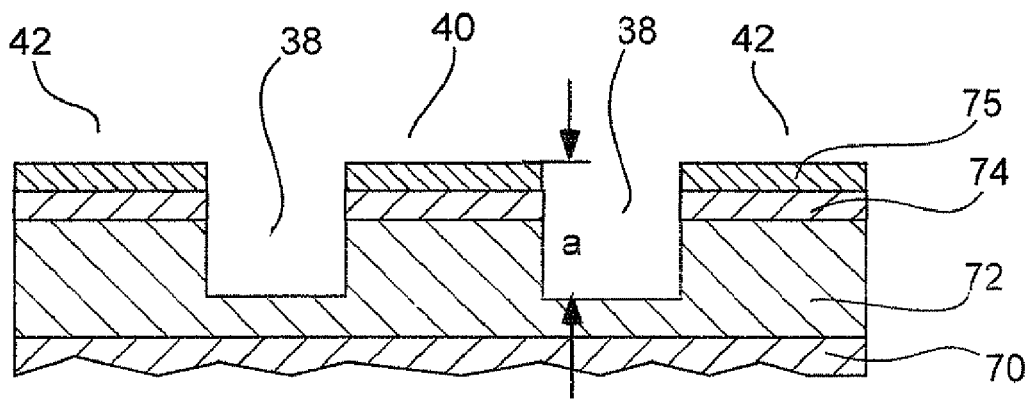

Referring now to FIG. 5, the resist pattern 76, which has been used for the above etching, is removed by an organic solvent, etc., with the result that the depth of the channels 38, that is, the height of the waveguide ridge 40, is equal to the etch depth a (500 nm (or 0.5 µm) plus the thickness of the deposited $SiO_2$ film 75). FIG. 5 shows the results of this process step.

Figure 6:
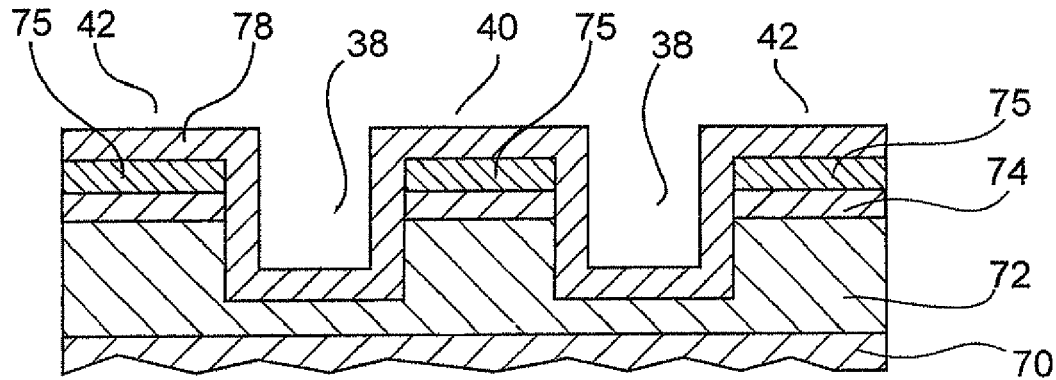

Referring now to FIG. 6, an $SiO_2$ film 78 which will become the first silicon oxide film 44 serving as a first insulating film is formed over the entire surface of the wafer by CVD, sputtering, etc. to a thickness of, e.g., 0.2 µm. The $SiO_2$ film 78 covers the top surface of the waveguide ridge 40, the inner surfaces of the channels 38, and the top surfaces of the electrode pad platforms 42, as shown in FIG. 6.

In the $SiO_2$ film 78, the etching rate of the $SiO_2$ film on the sides of the ridge need be equal to or lower than that of the $SiO_2$ film on the flat top of the ridge.

FIG. 6 shows the results of this process step.

It should be noted that instead of the $SiO_2$ film 78, one of the following insulating films may be formed: $SiO_x$ (0<x<2), SiN, SiON, $TiO_2$, $Ta_2O_5$, $Al_2O_3$ AlN, $ZrO_2$, $Nb_2O_5$, MgO, and SiC films.

Figure 7:
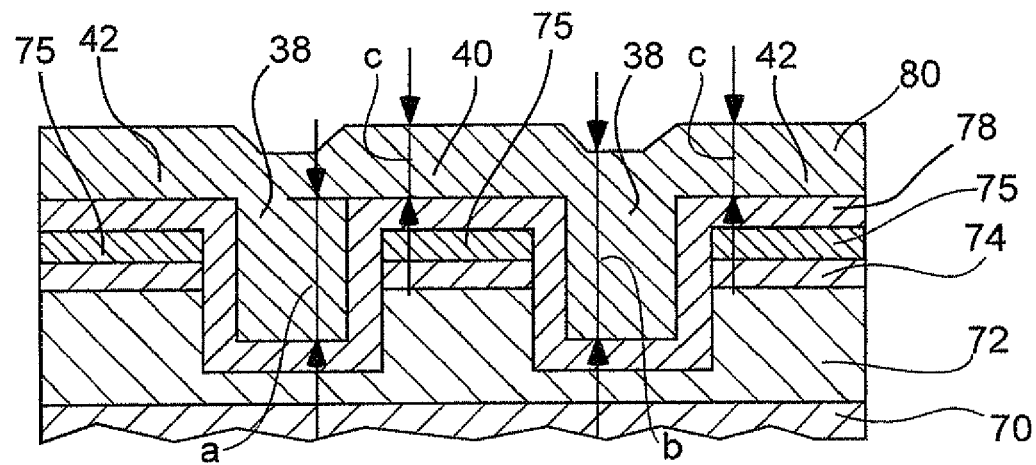

Referring now to FIG. 7, a photoresist is applied over the entire surface of the wafer to form a resist film 80 such that the thickness b of the resist film 80 on the channels 38 is greater than the thickness c of the resist film 80 on the top of the waveguide ridge 40 and on the tops of the electrode pad platforms 42. For example, the resist film 80 may be formed such that b~0.8 µm and c~0.4 µm.

Although in FIG. 7 the top surface of the resist film 80 is lower on the channels 38 than on the top of the waveguide ridge 40 and on the tops of the electrode pad platforms 42 (that is, the surface is concavely curved on the channels 38), it may be uniformly flat across the entire top surface of the resist film 80, which automatically ensures that b>c.

However, according to the present embodiment, the top surface of the resist film 80 may have any shape if the inequality b>c is satisfied. That is, the top surface of the resist film 80 may be concavely curved on the channels 38, as in FIG. 7.

Generally, spin coating is used to apply a photoresist to a wafer. That is, the resist is dropped onto the wafer, which is then rotated to form a film having a uniform thickness.

The thickness of the resist film can be controlled by adjusting the amount of photoresist applied to the wafer and its viscosity, and the rotational speed of the wafer and the time during which the wafer is rotated.

When a resist film is formed on a nonuniform wafer surface by spin coating (as shown in FIG. 7), the resultant film thickness is not uniform and greater on the concave portions of the surface (i.e., in the above example, on the bottom surfaces of the channels 38) than on the convex portions (i.e., in the above example, on the top surfaces of the waveguide ridge 40 and the electrode pad platforms 42). However, the amount of change in the thickness of the resist film across the surface depends on the viscosity of the photoresist.

In the case of a wafer such as that shown in FIG. 7, when the $SiO_2$ film 78 has the same thickness on the bottoms of the channels 38 as on the top of the waveguide ridge 40 and on the tops of the electrode pad platforms 42, if the viscosity of the photoresist is low, the equation b=c+a may hold, where: a is the etch depth of the channels 38, b is the thickness of the resist film 80 on the channels 38, and c is the thickness of the resist film 80 on the top of the waveguide ridge 40 and on the tops of the electrode pad platforms 42. That is, the top surface of the resist film 80 is uniformly flat.

On the other hand, when the top surface of the resist film 80 is not uniformly flat and is concavely curved on the channels 38, if the viscosity of the photoresist increases, the resist film 80 may have nearly the same thickness on the channels 38 as on the top of the waveguide ridge 40 and on the tops of the electrode pad platforms 42 (i.e., b~c).

It should be noted that in the wafer shown in FIG. 7 the resist film 80 has a greater thickness on the channels 38 than on the top of the waveguide 40 and on the tops of the electrode pad platforms 42 (i.e., b>c) unless the viscosity of the photoresist is extremely low.

Thus, by suitably adjusting the viscosity of the resist and the rotational speed of the wafer, it is possible to form the resist film 80 such that the inequality b>c holds, where b is the thickness of the resist film 80 on the channels 38 and c is the thickness of the resist film 80 on the top of the waveguide ridge 40 and on the tops of the electrode pad platforms 42. FIG. 7 shows the results of this process step.

Figure 8:
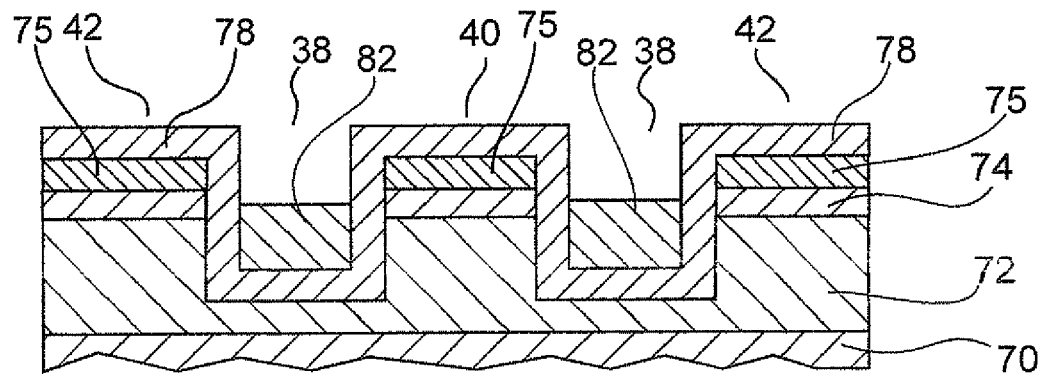

Referring now to FIG. 8, material is uniformly removed from the surface of the resist film 80 (or the resist film 80 is etched back) so that the resist film 80 is completely removed from on top of the waveguide ridge 40 and the electrode pad platforms 42 but left in the channels 38, thereby forming a resist pattern 82 that exposes the $SiO_2$ film 78 on the top of the waveguide ridge 40 and on the tops of the electrode pad platforms 42.

For example, a predetermined thickness of material is removed from the surface of the resist film 80, for example, by $O_2$ plasma dry etching so that the $SiO_2$ film 78 on the top of the waveguide ridge 40 and on the tops of the electrode pad platforms 42 are completely exposed but the resist film 80 is left in the channels 38.

According to the present embodiment, the top surface of the resist pattern 82 is slightly lower than the lower surface of the deposited $SiO_2$ film 75.

However, the resist pattern 82 can have any height (or thickness) as long as it completely covers the $SiO_2$ film 78 on the bottoms of the channels 38 and its top surface is lower than the top surfaces of the $SiO_2$ film 78 on the waveguide ridge 40 and the electrode pad platforms 42.

The above uniform etching of the surface of the resist film 80 is accurately stopped at a desired depth, as described below. For example, when the resist film is dry etched using $O_2$ plasma, the amount of etching is controlled in the following manner. In such etching, CO is generated and excited within the plasma to emit light having a wavelength of 451 nm. Therefore, the dry etching may be performed while externally observing the intensity of this light.

This method allows accurately detecting the amount of etching performed on the resist film 80 during the etching process. This makes it possible to etch the resist film 80 so that the film is completely removed from on top of the waveguide ridge 40 and the electrode pad platforms 42 but left in the channels 38, thereby forming the resist pattern 82.

It should be noted that the deposited $SiO_2$ film 75 may have an increased thickness to increase the allowable variation in the amount of etching performed in the above etch-back process.

FIG. 8 shows the results of this process step.

Figure 9:
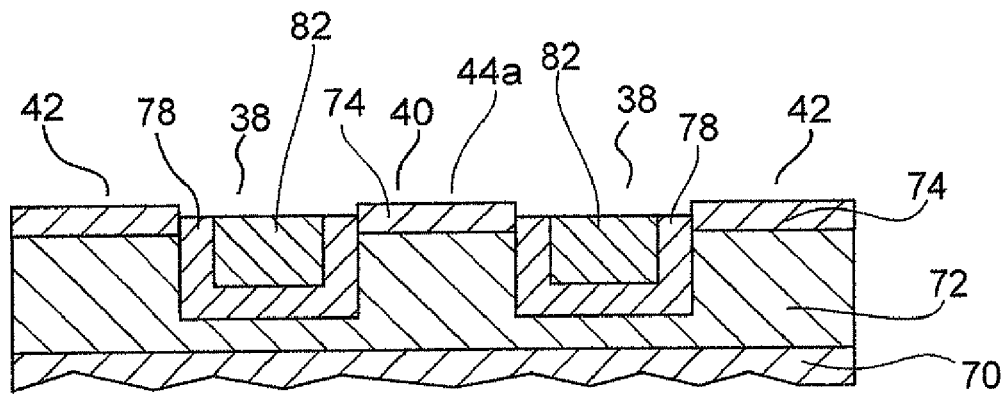

Referring now to FIG. 9, the exposed surface of the $SiO_2$ film 78 and then the deposited $SiO_2$ film 75 are uniformly etched by wet etching using the resist pattern 82 as a mask so that the $SiO_2$ film 78 and the deposited $SiO_2$ film 75 are completely removed from on top of the waveguide ridge 40 and the electrode pad platforms 42, but the $SiO_2$ film 78 is left on the sides and bottoms of the channels 38. The remaining portion of the $SiO_2$ film 78 has an opening 44a that exposes the p-GaN layer 74 at the top of the waveguide ridge 40.

The above wet etching may use buffered hydrofluoric acid, etc. as an etchant.

When forming the opening 44a in the $SiO_2$ film 78 in the manner described above, the process step does not use dry etching but uses wet etching in order to avoid damage to the p-GaN layer 74 and thereby prevent an increase in the contact resistance between the p-GaN layer 74 (or contact layer 36) and the overlying p-side electrode (formed later in the process), resulting in increased yield of the LD 10.

Further, when the deposited $SiO_2$ film 75 is wet etched by buffered hydrofluoric acid, etc., a single wavelength laser beam may be emitted from a location facing the wafer surface toward the deposited $SiO_2$ film 75 on the top of the waveguide ridge 40 and on the tops of the electrode pad platforms 42. The intensity of the reflected light may be then observed to determine the remaining thickness of the deposited $SiO_2$ film 75 on the top of the waveguide ridge 40 and on the tops of the electrode pad platforms 42. The etching may be stopped when the remaining thickness has been reduced to zero. FIG. 9 shows the results of this process step.

It should be noted that instead of forming the $SiO_2$ film 78, a silicon nitride film may be formed by CVD. In such a case, the silicon nitride film may be selectively etched by dry etching using $CF_4$, and then the deposited $SiO_2$ film 75 may be removed by wet etching using buffered hydrofluoric acid, etc.

In the case of a parallel plate dry etching apparatus, etching with $CF_4$ under the above conditions exhibits an SiN to $SiO_2$ etch selectivity ratio of 10 or more.

Figure 10:
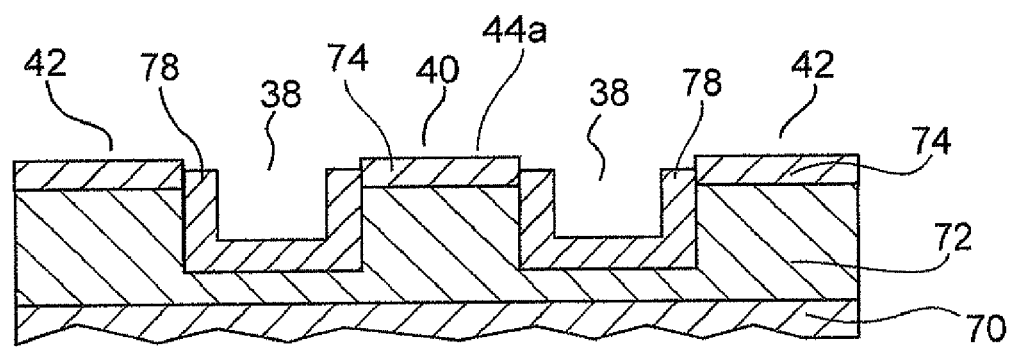

Referring now to FIG. 10, the resist pattern 82 is removed by wet etching using an organic solvent. It should be noted that a mixed solution of sulfuric acid and hydrogen peroxide solution may be used instead of an organic solvent.

Figure 11:
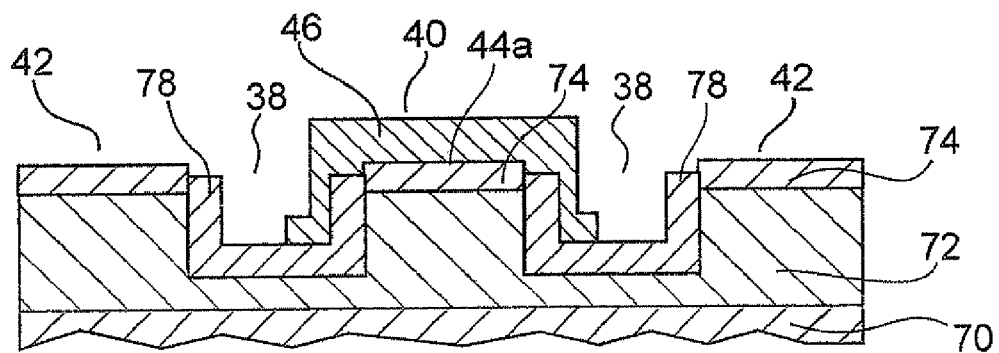

Referring now to FIG. 11, a p-side electrode 46 is formed on the top of the waveguide ridge 40.

More specifically, first, a resist is applied over the entire surface of the wafer and patterned by a photolithography process into a resist pattern (not shown) that exposes the top surface of the p-GaN layer 74 (i.e., the top layer of the waveguide ridge 40), the sidewalls of the waveguide ridge 40, and portions of the bottoms of the channels 38. An electrode layer made up of a laminated structure of Pt and Au is then formed over the resist pattern by, for example, vacuum deposition, and the resist film (or pattern) and the overlying portion of the electrode layer on the resist film are removed by lift-off to form the p-side electrode 46.

Thus, the top surface of the p-GaN layer 74 at the top of the waveguide ridge 40 and upper portions of both sides of the p-GaN layer 74 are not covered with the $SiO_2$ film 78 and are entirely exposed through the opening 44a (when the electrode layer is formed), preventing a reduction in the contact area and hence an increase in the contact resistance between the p-side electrode 46 and the p-GaN layer 74.

Since the top edges of the $SiO_2$ film 78 that covers the sides of the channels 38 are slightly lower than the top surface of the p-GaN layer 74, the p-side electrode 46 closely covers the top surface of the p-GaN layer 74 and upper portions of both sides of the p-GaN layer 74, resulting in an increase in the contact area and hence a reduction in the contact resistance between the p-side electrode 46 and the p-GaN layer 74. FIG. 11 shows the results of this process step.

Next, a second silicon oxide film 48 is formed.

Figure 12:
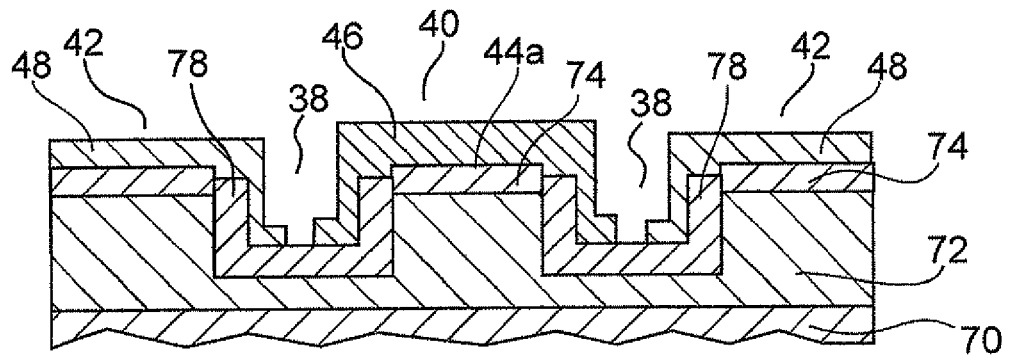

Specifically, referring to FIG. 12, first a resist is applied over the entire surface of the wafer and patterned by a photolithography process into a resist pattern (not shown) that exposes the surface of the wafer except for the surface of the p-side electrode 46 (that is, exposes the top surfaces of the electrode pad platforms 42, the sides of the electrode pad platforms 42 within the channels 38, and portions of the bottoms of the channels 38). An $SiO_2$ film is then formed over the entire surface of the wafer by vapor deposition to a thickness of 100 nm, and the resist film (pattern) on the p-side electrode 46 and the portion of the $SiO_2$ film on the resist film are removed by lift-off to form a second silicon oxide film 48 (made up of the remaining portions of the $SiO_2$ film). FIG. 12 shows the results of this process step.

It should be noted that instead of the SiO₂ film, one of the following insulating films may be formed: $SiO_x$ (0<x<2), SiN, SiON, TiO₂, Ta₂O₅, Al₂O₃, AlN, ZrO₂, and Nb₂O₅ films.

Figure 13:
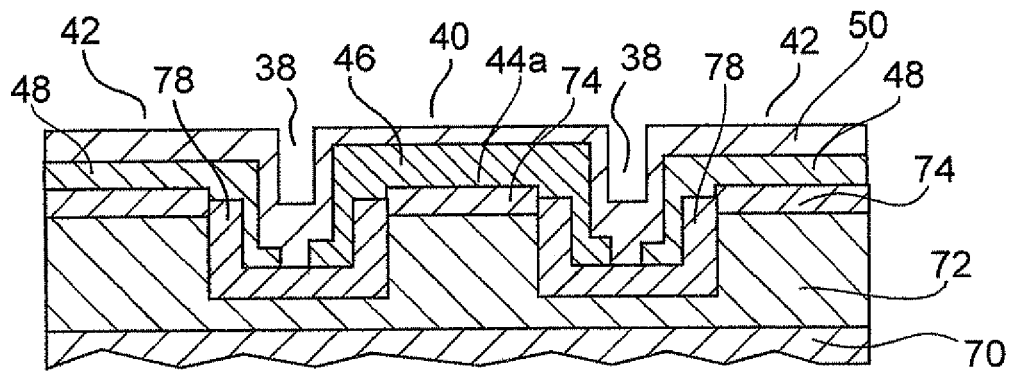

Lastly, referring now to FIG. 13, a metal film of Ti, Pt, and Au is formed over the p-side electrode 46, the channels 38, and the second silicon oxide film 48 to form a pad electrode 50 by vacuum deposition.

Variation 1

Figure 14:
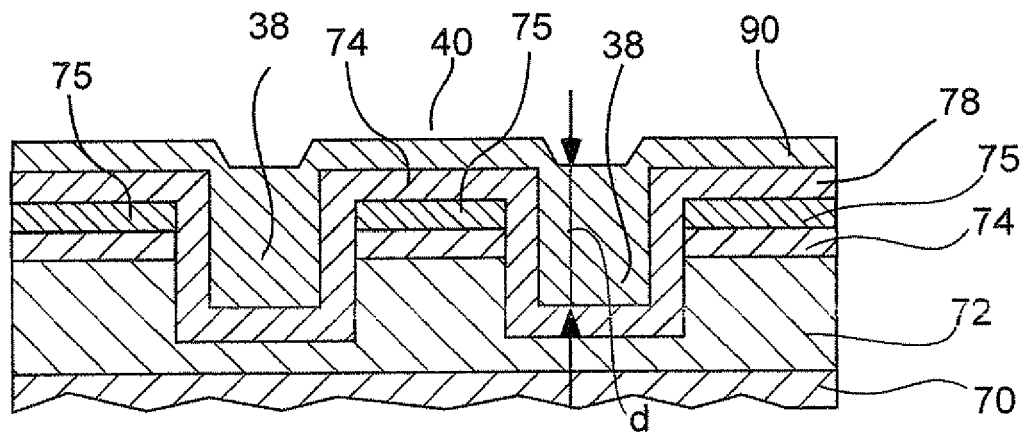
FIGS. 14 to 16 are partial cross-sectional views illustrating process steps in another method for manufacturing an LD according to the present invention.
Figure 15:
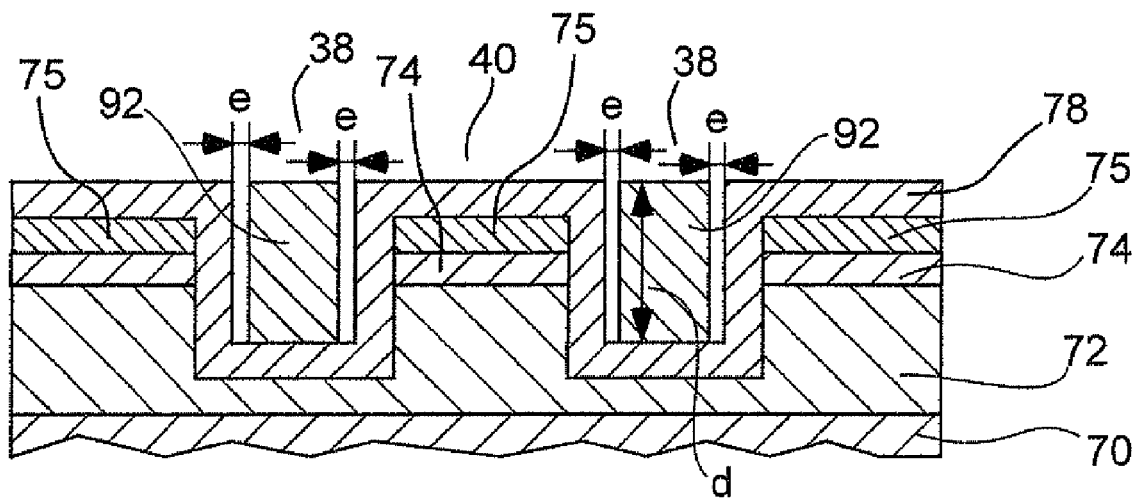
Figure 16:
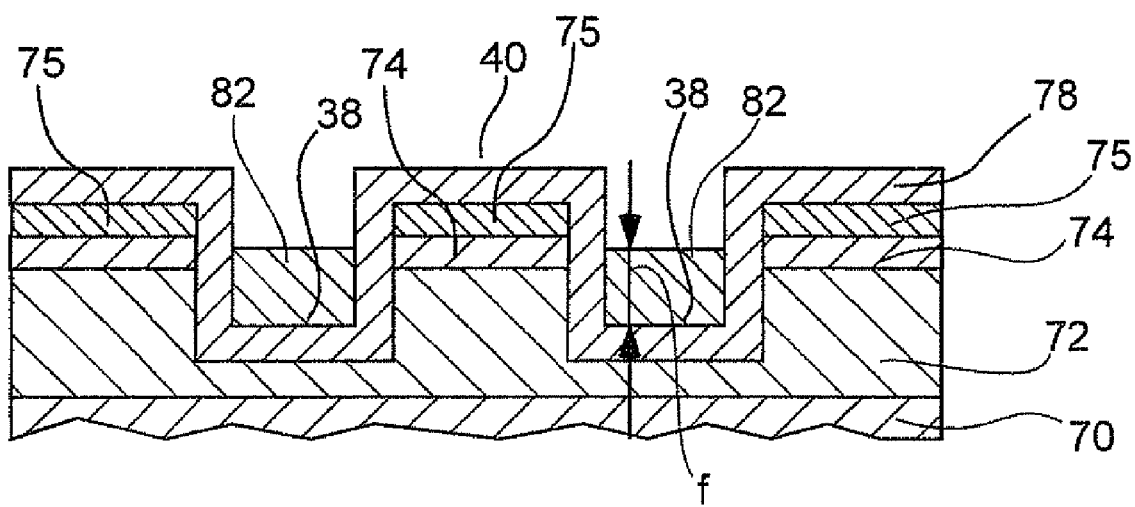

FIGS. 14 to 16 are partial cross-sectional views illustrating process steps in another method for manufacturing an LD according to the present invention.

The steps of the manufacturing method shown in FIGS. 1 to 6 are the same as those in this variation. However, this manufacturing method includes the steps shown in FIGS. 14 to 16 instead of those shown in FIGS. 7 and 8.

After the SiO₂ film 78 is formed over the top surface of the waveguide ridge 40, the inner surfaces of the channels 38, and the top surfaces of the electrode pad platforms 42 at the step shown in FIG. 6, referring now to FIG. 14, a photoresist predominantly composed of a thermoplastic resin such as a novolac resin is applied over the entire surface of the wafer to form a resist film 90 such that the top surfaces of the resist film 90 on the channels 38 adjacent the waveguide ridge 40 are substantially level with the top surface of the SiO₂ film 78 on the top of the waveguide ridge 40.

According to the present embodiment, the thickness d of the resist film 90 on the channels 38, that is, the height from the top surfaces of the SiO₂ film 78 on the bottoms of the channels 38 to the top surface of the resist film 90, is approximately 500 nm (0.5 μm) plus the thickness of the deposited SiO₂ film 75.

In this case, the thickness d of the resist film 90 on the channels 38 can be accurately controlled to a desired value by suitably adjusting the viscosity of the resist and the rotational speed of the wafer, as in the case of forming the resist film 80 described with reference to FIG. 7. FIG. 14 shows the results of this process step.

Referring now to FIG. 15, the resist film 90 is then removed by a photolithography process except on portions of the SiO₂ film 78 on the bottoms of the channels 38 to entirely expose the top surfaces of the SiO₂ film 78 on the top of the waveguide ridge 40 and on the tops of the electrode pad platforms 42, thereby forming a resist pattern 92. (The remaining portions of the resist film 90, which form the resist pattern 92, are spaced a predetermined distance e from the SiO₂ film 78 on the sidewalls of the waveguide ridge 40 and on the sidewalls of the electrode pad platforms 42 within the channels 38 and exposes the top surfaces of the SiO₂ film 78 on the top of the waveguide ridge 40 and on the tops of the electrode pad platforms 42, as shown in FIG. 15.)

Referring now to FIG. 16, the wafer is then heat treated, for example, at 140° C. in the atmosphere for 10 minutes to soften or plasticize the photoresist. As a result, material of the resist pattern 92 flows to fill the above gaps e between the resist pattern 92 and the SiO₂ film 78 on the sidewalls of the waveguide ridge 40 and on the sidewalls of the electrode pad platforms 42 (that is, material of the resist pattern 92 flows and comes into close contact with the SiO₂ film 78 on these sidewalls). As a result, the height of the top surface of the resist film is reduced. FIG. 16 shows the resultant resist pattern 82, which is left within the channels 38 and exposes the top of the waveguide ridge 40 and the tops of the electrode pad platforms 42. The top surfaces of this resist pattern 82 are slightly lower than the lower surfaces of the deposited SiO₂ film 75.

That is, the top surfaces of the resist pattern 82 within the channels 38 are slightly lower than the lower surfaces of the deposited SiO₂ film 75 on the top of the waveguide ridge 40 and the tops of the electrode pad platforms 42. The height of the resist pattern 82 is indicated by f in FIG. 16.

To achieve this, the gaps e are formed to have a size that allows the resist pattern 82 to have the desired height f, which may be calculated by assuming that the volume of the resist pattern does not change between the process steps shown in FIGS. 15 and 16 and hence the cross-sectional area of the resist pattern 82 is equal to that of the resist pattern 92.

It should be noted that although in FIG. 15 gaps e are provided on both sides of the resist pattern 92 within the channels 38, they may be provided only on one side of the resist pattern 92 if this allows the resist pattern 82 to have the desired height f.

The subsequent steps are the same as those shown in FIGS. 9 to 13 described above.

The above methods of the present embodiment for manufacturing the LD 10 proceeds as follows. An SiO₂ film 75 is deposited onto a wafer having a semiconductor layer stack thereon, and channels 38 are formed in the wafer, thereby forming a waveguide ridge 40 and electrode pad platforms 42. An SiO₂ film 78 is then formed over the entire surface of the wafer.

A resist is then applied over the entire surface of the wafer to form a resist film 80 having a greater thickness on the channels 38 than on the top of the waveguide ridge 40 and on the tops of the electrode pad platforms 42.

Next, material is uniformly removed from the surface of the resist film 80 so that the film is completely removed from on top of the waveguide ridge 40 and the electrode pad platforms 42 but left in the channels 38, thereby forming a resist pattern 82 that exposes the top of the waveguide ridge 40 and the tops of the electrode pad platforms 42.

The exposed surface of the SiO₂ film 78 and then the deposited SiO₂ film 75 are uniformly etched by wet etching using the resist pattern 82 as a mask so that the SiO₂ film 78 and the deposited SiO₂ film 75 are completely removed from on top of the waveguide ridge 40 and the electrode pad platforms 42, but the SiO₂ film 78 is left on the sides and bottoms of the channels 38. The remaining portion of the SiO₂ film 78 has an opening 44a that exposes the top of the waveguide ridge 40.

Then, after removing the resist pattern 82, a p-side electrode 46 is formed on the top of the waveguide ridge 40.

In these LD manufacturing methods, when the p-side electrode 46 is formed on and in contact with the top surface of a semiconductor layer (namely, the p-GaN layer 74, which will become the contact layer 36), the top surface of the p-GaN layer 74 is not covered with the SiO₂ film 78 and is entirely exposed through the opening 44a, thereby avoiding a reduction in the contact area between the p-side electrode 46 and the contact layer 36 to prevent an increase in the operating voltage. Further, the opening 44a is formed in the SiO₂ film 78 by wet etching, not by dry etching, in order to avoid damage to the p-GaN layer 74 and thereby prevent an increase in the contact resistance between the p-GaN layer 74 (or contact layer 36) and the overlying p-side electrode 46 and prevent an increase in the operating voltage. As a result, it is possible to manufacture the LD 10 having good characteristics with a high yield by employing a simple process.

As described above, a method for manufacturing a semiconductor optical device according to the present invention, comprising: forming a dielectric film on a top surface of a laminated semiconductor structure, the laminated semiconductor structure made up of a first semiconductor layer of a first conductive type, an active layer, and a second semiconductor layer of a second conductive type in sequence on a substrate; forming by a photolithography process a first resist pattern of a resist film disposed on a surface of the dielectric film, the first resist pattern having a stripe-shaped portion corresponding to a waveguide ridge; removing the dielectric film by etching using the first resist pattern as a mask to expose the second semiconductor layer; removing portions of the upper surface side of the second semiconductor layer by dry etching using the first resist pattern as a mask to form concave portions leaving a part of the second semiconductor layer on the bottom, and to form the waveguide ridge put into the concave portions; forming a first insulating film on surfaces of the concave portions and the waveguide ridge with the dielectric film at the top surface thereof after removing the first resist pattern; forming a second resist pattern covering the first insulating film in the concave portions adjacent the waveguide ridge and exposing the surface of the first insulating film on the top of the waveguide ridge, the second resist pattern having a top surface on the concave portions being lower than a top surface of the first insulating film on a top of the waveguide ridge; removing the first insulating film and the dielectric film by etching including wet etching using the second resist pattern as a mask to expose the second semiconductor layer in the waveguide ridge, and removing the second resist pattern; and forming a metal electrode layer on the exposed surface of the second semiconductor layer in the waveguide ridge.

Thus, in the method of the present invention for manufacturing a semiconductor optical device, the second resist pattern is formed to cover the first insulating film on the concave portions such that the top surfaces of the second resist pattern in the concave portions are lower than the top surface of the first insulating film on the top of the waveguide ridge. Further, an opening is formed in the first insulating film by etching including wet etching using the above second resist pattern as a mask to expose the second semiconductor layer at the top of the waveguide ridge.

Accordingly, this arrangement allows the electrode layer to be formed on and in full contact with the second semiconductor layer while avoiding a reduction in the contact area between them. Furthermore, the opening is formed by first removing portions of the first insulating film and then removing the dielectric film by etching including wet etching using the second resist pattern as a mask. Therefore, it is possible to avoid damages to the second semiconductor layer and thereby prevent an increase in the contact resistance between the second semiconductor layer and the electrode layer. By extensions, it is possible to manufacture a semiconductor optical device having good characteristics with a high yield by employing a simple process.

Thus, above methods for manufacturing a semiconductor optical device according to the present invention are suitable for manufacturing a semiconductor optical device in which the waveguide ridge has an electrode on its top.

While the presently preferred embodiments of the present invention have been shown and described. It is to be understood these disclosures are for the purpose of illustration and that various changes and modifications may be made without departing from the scope of the invention as set forth in the appended claims.

What is claimed is:

1. A method for manufacturing a semiconductor optical device, comprising:
    forming a dielectric film on a top surface of a laminated semiconductor structure, the laminated semiconductor structure including a first semiconductor layer of a first conductivity type, an active layer, and a second semiconductor layer of a second conductivity type, in sequence, on a substrate;
    forming by photolithography a first resist pattern of a first resist film disposed on a surface of the dielectric film, the first resist pattern having a stripe-shaped portion corresponding to a waveguide ridge;
    partially removing the dielectric film by etching, using the first resist pattern as a mask, to expose the second semiconductor layer;
    removing portions of an upper surface side of the second semiconductor layer by dry etching, using the first resist pattern as a mask, to form concave portions, leaving part of the second semiconductor layer, and to form the waveguide ridge between said concave portions;
    forming a first insulating film on surfaces of the concave portions and the waveguide ridge, with the dielectric film on a top surface of the waveguide ridge, after removing the first resist pattern;
    forming a second resist pattern covering the first insulating film in the concave portions, adjacent the waveguide ridge, and exposing the surface of the first insulating film on the top of the waveguide ridge, the second resist pattern having a top surface in the concave portions that is closer to the substrate than a top surface of the first insulating film on the top surface of the waveguide ridge;
    removing the first insulating film and the dielectric film by etching, including wet etching, using the second resist pattern as a mask, to expose the second semiconductor layer in the waveguide ridge, and removing the second resist pattern; and
    forming a metal electrode layer on the second semiconductor layer exposed in the waveguide ridge.

2. The method for manufacturing a semiconductor optical device according to claim 1, including forming the dielectric film by vapor deposition.

3. The method for manufacturing a semiconductor optical device according to claim 1, including removing both the first insulating film and the dielectric film by wet etching.

4. The method for manufacturing a semiconductor optical device according to claim 1, including removing the second resist pattern by wet etching.

5. The method for manufacturing a semiconductor optical device according to claim 1, wherein forming the second resist pattern includes:
    forming a second resist film over the first insulating film, the resist film having a greater thickness in the concave portions adjacent the waveguide ridge than on the top of the waveguide ridge, and
    removing uniformly material from a top surface of the resist film to expose the first insulating film on the top of the waveguide ridge, leaving the resist film in the concave portions adjacent the waveguide ridge.

6. The method for manufacturing a semiconductor optical device according to claim 1, wherein the second semiconductor layer is one or more semiconductor layers containing GaN.

* * * * *